(12) United States Patent
Darolia et al.

(10) Patent No.: US 8,017,195 B2
(45) Date of Patent: Sep. 13, 2011

(54) METHOD FOR VIBRATIONAL DAMPING OF GAS TURBINE ENGINE AIRFOILS

(75) Inventors: Ramgopal Darolia, West Chester, OH (US); Matthew Mark Weaver, Loveland, OH (US); Dennis Martin Corbly, Dayton, OH (US); Boris Alexeevich Movchan, Kyiv (UA); Anatolii Ivanovich Ustinov, Kyiv (UA)

(73) Assignee: General Electric Company, Schenectady, NY (US)

( * ) Notice: Subject to any disclaimer, the term of this patent is extended or adjusted under 35 U.S.C. 154(b) by 690 days.

(21) Appl. No.: 11/748,625

(22) Filed: May 15, 2007

(65) Prior Publication Data
US 2010/0136254 A1    Jun. 3, 2010

Related U.S. Application Data

(62) Division of application No. 10/711,888, filed on Oct. 12, 2004, now Pat. No. 7,250,224.

(51) Int. Cl.
*B05D 3/00* (2006.01)
*C23C 4/00* (2006.01)
*C23C 4/02* (2006.01)
*C23C 4/06* (2006.01)
*C23C 14/02* (2006.01)
*C23C 14/14* (2006.01)
*C23C 30/00* (2006.01)

(52) U.S. Cl. ........ 427/534; 427/327; 427/328; 427/405; 427/255.7

(58) Field of Classification Search .................. 428/629, 428/632, 673, 646, 648, 678, 680, 681, 615, 428/570, 639, 649, 666, 220, 702, 660
See application file for complete search history.

(56) References Cited

U.S. PATENT DOCUMENTS

| | | | |
|---|---|---|---|
| 3,248,251 A * | 4/1966 | Allen | 428/559 |
| 3,301,530 A | 1/1967 | Lull | |
| 3,758,233 A | 9/1973 | Newman et al. | |
| 4,861,618 A | 8/1989 | Vine et al. | |
| 5,976,695 A | 11/1999 | Hajmrle et al. | |
| 6,159,547 A | 12/2000 | McMordie et al. | |
| 2004/0096332 A1 | 5/2004 | Shipton et al. | |

FOREIGN PATENT DOCUMENTS

| | | |
|---|---|---|
| WO | WO9217323 | 10/1992 |
| WO | WO9631687 | 10/1996 |

* cited by examiner

*Primary Examiner* — Michael La Villa
(74) *Attorney, Agent, or Firm* — William Scott Andes; Gary M. Hartman; Domenica N. S. Hartman

(57) ABSTRACT

A coating system and coating method for damping vibration in an airfoil of a rotating component of a turbomachine. The coating system includes a metallic coating on a surface of the airfoil, and a ceramic coating overlying the metallic coating. The metallic coating contains metallic particles dispersed in a matrix having a metallic and/or intermetallic composition. The metallic particles are more ductile than the matrix, and have a composition containing silver and optionally tin. The method involves ion plasma cleaning the surface of the airfoil before depositing the metallic coating and then the ceramic coating.

26 Claims, 1 Drawing Sheet

METHOD FOR VIBRATIONAL DAMPING OF GAS TURBINE ENGINE AIRFOILS

CROSS REFERENCE TO RELATED APPLICATIONS

This is a division patent application of U.S. patent application Ser. No. 10/711,888, filed Oct. 12, 2004 now U.S. Pat. No. 7,250,224, whose contents are incorporated herein by reference.

BACKGROUND OF THE INVENTION

The present invention generally relates to airfoils, and more particularly to coatings and methods for vibrational damping of fan and compressor airfoils of gas turbine engines.

Gas turbine engines employ airfoils that extend radially across the airflow path through the engine. Airfoils of rotating components of a gas turbine engine, usually termed blades ("buckets" in industrial turbines), extend radially outward from disks or rotors within the fan and compressor sections of the engines. During engine operation, the air flowing over these blades will vary in terms of speed, temperature, pressure, and density, resulting in the blades being excited in a number of different modes of vibration that induce bending and torsional twisting of the blades. The resulting vibration-induced stresses in the blades can cause high cycle fatigue (HCF), particularly if blades are excited at their resonant frequencies.

Several technologies have been investigated to address the need for damping fan and compressor airfoils. Notable examples include visco-elastic constraint layer damping systems (VE/CLDS), air-films, and internal dampers. U.S. Pat. No. 3,301,530 to Lull discloses a damping coating system that makes use of inner and outer metallic coatings, wherein the inner coating has a modulus of elasticity between that of the outer coating and the blade material. According to Lull, shear stresses generated by the differing moduli of elasticity are able to absorb energy and damp vibration in the blade. Another example of a damping coating system is disclosed in U.S. Pat. No. 3,758,233 to Cross et al., in which a ceramic material is employed as an outer coating that overlies an inner coating containing a mixture of the ceramic material and the blade material.

The existing damping technologies generally have limitations related to temperature, structural integrity, aerodynamic efficiencies, and manufacturing difficulties. While the use of thin damping coating systems are attractive from the standpoint of structural integrity, aerodynamic efficiencies, and manufacturing, the ability to survive at the operating temperatures of a gas turbine engine remains a challenge. Additional challenges associated with such coatings include spall resistance under thermal cycling conditions, erosion resistance, impact resistance, high temperature stability, and minimum impact on the fatigue lives of the airfoils. Finally, maximizing the damping effectiveness of the coating (lowest possible Q with the thinnest coating) is understood to be an important goal of any damping coating system.

BRIEF SUMMARY OF THE INVENTION

The present invention provides a coating system and coating method for damping vibration in an airfoil of a rotating component of a turbomachine, notable examples of which include fan and compressor blades formed of titanium-based alloys such as Ti-6Al-4V. The coating system includes a metallic coating on a surface of the airfoil, and a ceramic coating overlying the metallic coating. The metallic coating contains metallic particles dispersed in a metallic and/or intermetallic matrix. The metallic particles are more ductile than the matrix and have a composition containing silver and optionally tin. The method of this invention involves ion plasma cleaning the surface of the airfoil before depositing the metallic coating and then the ceramic coating.

An important feature of the invention is that the coating system is capable of significantly damping vibration in a rotating airfoil, even if deposited to have a total thickness of not more than 100 micrometers. Other advantages include spall resistance, impact resistance, and high temperature stability. The ceramic layer provides erosion resistance for the metallic coating to further promote the durability of the coating system. The coating system does not detrimentally impact the fatigue life of an airfoil, and has the potential to maintain and possibly improve the HCF lives of airfoils.

In addition to the above-noted property-related advantages, the invention has a number of notable process-related advantages, including the ability of the metallic and ceramic layers to be deposited in a single coating cycle using existing deposition technology. The metallic and ceramic coatings can be deposited as discrete layers or deposited so that a compositionally-graded region is formed therebetween to promote adhesion and reduce stresses caused by differences in the coefficients of thermal expansion of the materials used to form the layers.

Other objects and advantages of this invention will be better appreciated from the following detailed description.

DETAILED DESCRIPTION OF THE INVENTION

Figure 1:
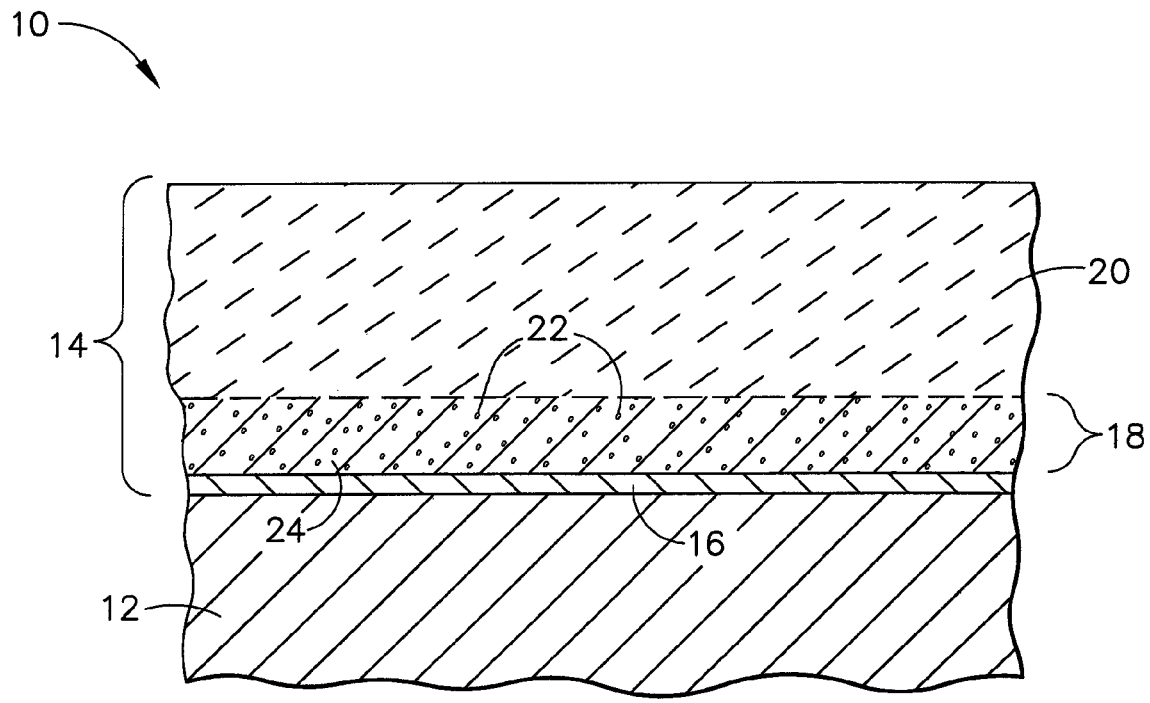
FIG. 1 is a fragmentary cross-sectional view of a surface region of an airfoil on which has been deposited a damping coating system in accordance with a preferred embodiment of this invention.

FIG. 1 schematically represents a surface region 12 of a gas turbine engine airfoil 10 on which a coating system 14 is provided in accordance with the invention. The invention is particularly applicable to blades within the fan and compressor sections of a gas turbine engine, though other airfoils in an airflow path and susceptible to vibration-induced fatigue can also benefit from this invention. The airfoil 10 can be formed of a variety of materials, including nickel, iron and cobalt-based superalloys and titanium alloys such as Ti-6Al-4V, the latter of which is a common alloy for fan and compressor blades.

The coating system 14 is represented as including a metallic underlayer 18 and a ceramic overlayer 20 on and directly contacting the underlayer 18. The underlayer 18 contains a dispersion of ductile metallic grains or particles 22 dispersed in a matrix 24 having a metallic and/or intermetallic composition. The particles 22 are micrometer-size (i.e., having a nominal dimension of less than one millimeter), and more preferably nanometer-size (i.e., having a nominal dimension of less than one micrometer). The composition of the underlayer 18 is chosen so that it has a sufficiently ductile component that provides a damping effect to reduce vibration-induced stresses in the airfoil 10, while the ceramic composition of the overlayer 20 is chosen to provide an erosion-resistant outer surface for the coating system 14. An optional bond coat 16 is shown between the underlayer 18 and the surface region 12 of the airfoil 10 for the purpose of promoting adhesion of the coating system 14 to the surface region 12.

In FIG. 1, compositional grading between the underlayer 18 and overlayer 20 is indicated by the phantom line between these regions of the coating system 14. As such, intermixing between the compositions of the underlayer 18 and overlayer 20 may be present to the extent that the overlayer 20 and underlayer 18 effectively form a single graded layer. However, grading is not required, and the underlayer 18 and overlayer 20 may be present as discrete layers with a distinct interface therebetween (e.g., along the phantom line). The outer surface region of the overlayer 20 is represented in FIG. 1 as being formed entirely of ceramic, though metallic particles of the underlayer 18 may extend up into the outer surface region of the overlayer 20. One or more intermediate layers (not shown) may be deposited so as to lie between the damping underlayer 18 and the ceramic overlayer 20, such as for the purpose of further increasing the damping capacity of the coating system 14.

The coating system 14 as described above exhibits a combination of metallic (ductile) and ceramic (hard) behavior that provides a significant damping effect, preferably at relatively thin thicknesses such as in the range of about 25 to about 100 micrometers. Compositions for the metallic underlayer 18 of this invention contain silver, chromium, and optionally tin. The particles 22 preferably contain the more ductile constituent(s) of the underlayer 18 (e.g., silver, tin, and/or alloys thereof), while the matrix 24 is formed of the harder constituent(s) of the underlayer 18 (e.g., chromium and/or alloys and/or intermetallics thereof). If deposited on a titanium-containing substrate such as Ti-6Al-4V, the underlayer 18 will also contain titanium as a result of diffusion, with the titanium residing primarily within the particles 22 (yielding, e.g., SnTiAg). Various ceramic compositions can be used for the overlayer 20, a particularly notable example being magnesia (MgO). The matrix 24 of the underlayer 18 will also tend to contain compounds formed by interdiffusion/intermixing with the overlayer 20 and/or surface region 12 and oxidation of the underlayer 18 constituents during deposition. Examples of such compounds include chromia ($Cr_2O_3$), stannic oxide ($SnO_2$), magnesium chromate ($MgCr_2O_4$) if the overlayer 20 contains magnesia, etc. Any intermediate layer(s) provided between the damping underlayer 18 and the ceramic overlayer 20 to further increase the damping capacity of the coating system 14 preferably also relies on a damping reduction mechanism employing combinations of ductile and hard materials whose interfaces provide a damping effect. Suitable materials for the intermediate layer(s) are believed to be metallic and intermetallics compositions based on silver, tin, chromium, alloys of these metals, and mixtures thereof.

In an investigation leading up to this invention, a coating system having a metallic tin underlayer and a ceramic outer coating of magnesia was shown to have a desirable damping effect. The coating system was formed by depositing a thin layer of tin, over which a layer of chromium was deposited before depositing the magnesia coating. The layers were deposited by electron beam physical vapor deposition (EB-PVD) to thicknesses of about 40 micrometers and about 5 micrometers for the tin and chromium layers, respectively, and about 30 micrometers for the magnesia coating. The chromium layer was intentionally graded with the magnesia coating to strengthen the magnesia coating by dispersion strengthening with chromium, chromia ($Cr_2O_3$), and/or magnesium chromate ($MgCr_2O_4$) particles. Furthermore, it was determined that interdiffusion occurred during deposition of the tin and chromium layers to the extent that a single graded underlayer formed that was Sn-rich near the substrate and Cr-rich near the magnesia coating.

Tests were then performed to evaluate the damping effect of the coatings on flat specimens formed of Ti-6Al-4V alloy. The tests were performed with mechano-dynamic analysis equipment in which specimens were held at one end while their opposite ends were vibrated. Vibration was induced by rigidly attaching a ferromagnetic material to the vibrated ends of the specimens, and then surrounding the vibrated ends with a magnetic coil. A computer-controlled frequency generator was used to control vibration, and sensors were employed to record vibration and decay of vibration. The results indicated that the tin-chromium-magnesia coating system had a beneficial damping effect on the Ti-6Al-4V specimen. It is believed that tin was dispersed as nanometer or micrometer-sized particles in a matrix containing chromium and/or chromium-based intermetallics, along with MgO, $Cr_2O_3$, $SnO_2$, and/or $MgCr_2O_4$. It was concluded that the tin particles were largely responsible for providing the observed damping effect. The tin layer on the Ti-6Al-4V substrate surface also appeared to have the beneficial effect of healing surface defects (cracks, scratches, etc.), thereby maintaining and in some cases improving the HCF lives of coated specimens that underwent a series of HCF and LCF (low cycle fatigue) tests.

Though nanometer-sized particles of tin may remain trapped and stable in a chromium-containing matrix, the low melting temperature of tin (232° C.) is viewed as a potential limitation to the use of a tin-chromium-magnesia coating system as described above for airfoil applications that exceed the melting temperature of tin. Through a series of impact and erosion tests performed on the tin-chromium-magnesia coating system, improvements in coating adhesion and erosion resistance were also identified as properties in which improvements would be necessary for use in airfoil applications. Accordingly, investigations were undertaken in which the effects of underlayer composition, bond coats, and surface pretreatment were evaluated. These investigations led to improved properties by partially or completely replacing tin with silver within the underlayer 18. Particular elements and alloys identified in the investigation were silver and SnAg alloys, which further contain titanium if the substrate material is a titanium-containing alloy. In reference to FIG. 1, these alloys appear within the coating system 14 as nanometer and micrometer-sized particles 22 in a harder metallic and/or intermetallic matrix 24, which together formed the metallic underlayer 18 used in combination with the ceramic overlayer 20. In addition to the beneficial effects of the composition of the underlayer 18, ion plasma cleaning of the surface prior to coating deposition was found to significantly improve adhesion of the metallic underlayer 18 to surfaces of a titanium alloy such as Ti-6Al-4V. Further improvements in adhesion were achieved with the development of suitable bond coats 16, particularly those formed of metallic hafnium and silver.

In one series of tests, coating systems of the type shown in FIG. 1 were deposited on flat specimens formed of Ti-6Al-4V alloy in the same manner as that described above for the previous tin-chromium-magnesia coating systems. On the basis of the previous investigations, chromium was again chosen as the base material for the matrix 24 in view of its hardness and its ability to strengthen a ceramic overlayer 20 formed of magnesia or other ceramic materials suitable for use in the invention. The remaining constituents of the underlayer 18 were chosen on the basis of being ductile and insoluble in chromium, thereby resulting in their presence as fine particles 22 within the chromium-base matrix 24. Each coating system was deposited using an ingot of magnesia in which islands of tin, silver and/or chromium were provided. During evaporation by EBPVD, the separate constituents evaporated in the following order, based on their melting points and vapor pressures: tin, silver, chromium, and then magnesia. Coating processes were carried out to produce coating systems with specific compositions for the metallic underlayers as follows (approximate by weight): 50% Sn and 50% Cr; 50% Ag, 17% Sn and 32% Cr; 40% Ag, 24% Sn and 37% Cr; and 29% Ag and 71% Cr. The compositions produced underlayers with particles containing SnAg, Sn, and/or Ag in a matrix of chromium and/or chromium intermetallic, with each underlayer overlaid by a magnesia coating. The coating systems were deposited to thicknesses of about 40 micrometers, with the metallic underlayers accounting for about 10 micrometers of the total coating thickness and the magnesia overlayers accounting for about 30 micrometers of the total coating thicknesses. Considerable interdiffusion occurred between the constituents of the underlayers, as well as interdiffusion with the Ti-6Al-4V substrates, leading to the more ductile constituents (i.e., tin and silver) being dispersed as particles in a matrix formed of the harder constituent (i.e., a chromium matrix additionally containing MgO, $Cr_2O_3$, $SnO_2$, and/or $MgCr_2O_4$).

Figure 2:
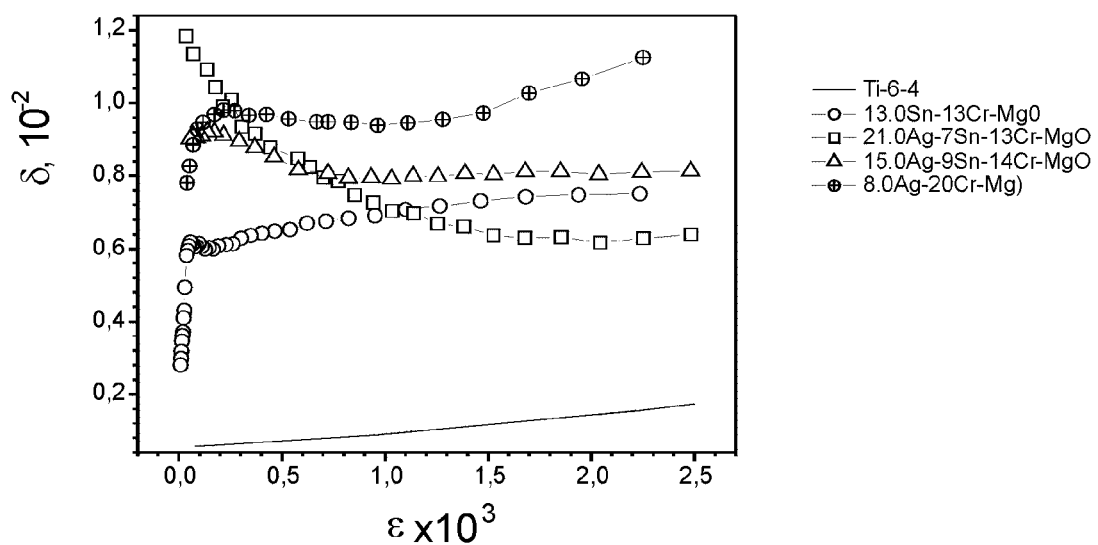
FIG. 2 is a graph comparatively evidencing the damping effect of coating systems of the type shown in FIG. 1.

The specimens underwent essentially the same mechano-dynamic analysis testing as was performed to evaluate the earlier tin-chromium-magnesia coating system. As evident from FIG. 2, which is a plot comparing logarithmic decrement versus strain for the coated specimens and an uncoated specimen, it can be seen that the damping behaviors of the two AgSnCr—MgO coating systems and the AgCr—MgO coating system were found to be equal or better than the Sn—Cr—MgO coating system.

From the above investigation, it was concluded that suitable compositions for the metallic underlayer 18 of this invention contain silver and chromium, optionally tin. The ductile constituents (silver and tin) of the underlayer 18 account for, by weight, at least 25% up to about 50% of the underlayer 18, and the harder constituents (chromium) account for, by weight, at least 50% up to about 75% of the underlayer 18. With these compositions, the constituents of the underlayer 18 will interact and interdiffusion will occur between the underlayer and its underlying substrate 12, with the result that the underlayer 18 will comprise particles 22 of the more ductile constituents (e.g., silver, tin, and/or alloys thereof) dispersed in a harder matrix 24 of chromium, which further contains MgO, $Cr_2O_3$, $SnO_2$, and/or $MgCr_2O_4$ as a result of the deposition process.

Processing trials were then performed to improve the adhesion and impact resistance of vibration-damping coating systems. In particular, the trials investigated the effect that surface preparation and cleaning of a Ti-6Al-4V alloy substrate prior to EBPVD deposition of the metallic underlayer. Specimens used in the trials were flat Ti-6Al-4V plates having thicknesses of about 1.5 millimeters, lengths of about 100 millimeters, and widths tapering from about 28 millimeters to about 12 millimeters between opposite ends of the specimens. The coating systems consisted of an approximately 10 micrometer-thick metallic underlayer of tin and chromium (approximate 50% Sn and 50% Cr, by weight), and an approximately 30 micrometer-thick ceramic overlayer of magnesia. All specimens underwent a pre-coating surface treatment that involved polishing with a 600-grit abrasive ($SiO_2$) paper followed by ultrasonic cleaning in acetone. Some specimens further underwent ion plasma cleaning, while the remaining specimens (baseline specimens) did not. Parameters of the ion plasma cleaning process included argon as the ionization gas at a partial pressure of about $3 \times 10^{-4}$ torr (about $4-10^{-4}$ mbar), an ion source voltage (+) of about 2000V, a specimen voltage (−) of about 750V, an ion current of about 20 mA, and a duration of about five to ten minutes. Each specimen was then impacted with a chromium steel ball bearing (0.175 inch (about 4.3 mm) diameter) at a velocity of between about 300 and about 350 ft/sec (about 90 and about 110 m/s). Adhesion was assessed on the basis of the size of the spalled area resulting from impact. The tests indicated that ion plasma cleaning was able to significantly improve coating adhesion under impact conditions, reducing surface area of coating loss by a factor of about ten in comparison to the baseline specimens.

Finally, adhesion enhancement through the use of bond coat materials was also evaluated using identical specimens (Ti-6Al-4V), underlayer composition (50% Sn and 50% Cr, by weight), pre-coating grit-blast surface treatment, and impact test procedure as described above for the baseline specimens of the preceding surface preparation evaluation. Bond coats evaluated were formed entirely of either hafnium or silver, and were deposited by EBPVD to thicknesses of about three to about five micrometers on the grit-blasted Ti-6Al-4V specimens. Because of interdiffusion between the bond coats and the underlayers, the bond coats contained small amounts (e.g., up to about 25 weight percent) of tin and chromium that had diffused from the underlayers, and the underlayers contained small amounts (e.g., up to about 25 weight percent) of hafnium or silver that had diffused from the bond coat. The impact tests indicated that the bond coats were able to significantly improve adhesion of the underlayers under impact conditions, further reducing surface area of coating loss by a factor of about ten as compared to the baseline specimens of the preceding surface preparation investigation. From the impact tests, it was concluded that bond coats formed of hafnium, silver, and presumably combinations thereof are capable of significantly improving the adhesion of the metallic underlayers to the Ti-6Al-4V alloy. It is believed that hafnium bond coats would be preferred for underlayer compositions containing a significant amount of silver, since a silver bond coat would have minimal effect on the adhesion of such an underlayer. On the basis of ductility and oxygen gettering, it is further believed that bond coats of zirconium, alone or in combined with hafnium and/or silver, should also perform well with coating systems 14 within the scope of this invention.

While the invention has been described in terms of particular embodiments, it is apparent that other forms could be adopted by one skilled in the art. For example, while the underlayers 18 were deposited by EBPVD, and PVD techniques such as EBPVD, sputtering, and ion plasma are believed to be preferred for their ability to control the coating thickness, other deposition techniques are also possible, such as plasma spraying. Therefore, the scope of the invention is to be limited only by the following claims.

The invention claimed is:

1. A method for providing a coating system on an airfoil of a rotating component of a turbomachine, the method comprising the steps of:
   ion plasma cleaning a surface of the airfoil to produce a cleaned surface; and
   depositing the coating system on the cleaned surface of the airfoil, the coating system being deposited to comprise a metallic coating and a ceramic coating;
   wherein the metallic coating is deposited to a sufficient thickness to damp vibration in the airfoil, the metallic coating comprising metallic particles dispersed in a matrix material having a metallic and/or intermetallic composition, each of the metallic particles being more ductile than the matrix material and having a composition containing silver and optionally tin; and wherein the ceramic coating is deposited so as to overlie the metallic coating.

2. The method according to claim 1, wherein the matrix material of the metallic coating consists essentially of chromium and chromium-based intermetallic phases.

3. The method according to claim 1, wherein the composition of the metallic particles is selected from the group consisting of alloys of silver, SnAg, and SnTiAg.

4. The method according to claim 1, wherein the metallic coating, the metallic particles thereof, and the matrix material thereof are substantially free of tin.

5. The method according to claim 1, wherein the metallic coating further comprises oxides selected from the group consisting of oxides formed by oxidation of elements of the metallic particles during deposition of the metallic coating, oxides formed by oxidation of the metallic composition of the matrix material during deposition of the metallic coating, and oxides resulting from interdiffusion and/or intermixing with the ceramic coating.

6. The method according to claim 1, wherein the metallic particles have nominal dimensions of less than one millimeter.

7. The method according to claim 6, wherein at least some of the metallic particles have nominal dimensions of less than one micrometer.

8. The method according to claim 1, wherein the ceramic coating has a composition comprising magnesia.

9. The method according to claim 1, wherein the metallic coating and the ceramic coating are deposited by physical vapor deposition.

10. The method according to claim 1, wherein the metallic coating and the ceramic coating are deposited so as to cause intermixing of the metallic coating and the ceramic coating and create a compositionally graded region therebetween.

11. The method according to claim 1, wherein the metallic coating and the ceramic coating are deposited to contact each other at a distinct interface.

12. The method according to claim 1, wherein the coating system is deposited on the cleaned surface of the airfoil to further comprise a metallic bond coat, wherein the metallic bond coating is deposited on the cleaned surface of the airfoil before depositing the metallic coating, the metallic bond coat promoting adhesion of the metallic coating to the airfoil.

13. The method according to claim 12, wherein the metallic bond coat is predominantly hafnium, silver, or a mixture thereof.

14. The method according to claim 13, wherein the metallic bond coat consists essentially of hafnium, optionally silver, and up to 25 weight percent of constituents that diffused from the metallic coating into the bond coat.

15. The method according to claim 1, wherein the airfoil is formed of a titanium alloy.

16. A method for providing a coating system on an airfoil of a rotating component of a turbomachine, the method comprising depositing the coating system on a surface of the airfoil so that the coating system comprises a metallic coating and a ceramic coating, wherein:

the metallic coating is deposited to a sufficient thickness to damp vibration in the airfoil, the metallic coating comprising metallic particles dispersed in a matrix material having a metallic and/or intermetallic composition, each of the metallic particles being more ductile than the matrix material and having a composition containing silver and optionally tin; and the ceramic coating is deposited so as to overlie the metallic coating.

17. The method according to claim 16, wherein the matrix material of the metallic coating consists essentially of chromium and chromium-based intermetallic phases.

18. The method according to claim 16, wherein the composition of the metallic particles is selected from the group consisting of alloys of silver, SnAg, and SnTiAg.

19. The method according to claim 16, wherein the metallic coating, the metallic particles thereof, and the matrix material thereof are substantially free of tin.

20. The method according to claim 16, wherein the metallic coating further comprises oxides selected from the group consisting of oxides formed by oxidation of elements of the metallic particles during deposition of the metallic coating, oxides formed by oxidation of the metallic composition of the matrix material during deposition of the metallic coating, and oxides resulting from interdiffusion and/or intermixing with the ceramic coating.

21. The method according to claim 16, wherein the metallic coating and the ceramic coating are deposited so as to cause intermixing of the metallic coating and the ceramic coating and create a compositionally graded region therebetween.

22. The method according to claim 16, wherein the metallic coating and the ceramic coating are deposited to contact each other at a distinct interface.

23. The method according to claim 16, wherein the coating system is deposited on the surface of the airfoil to further comprise a metallic bond coat, wherein the metallic bond coating is deposited on the surface of the airfoil before depositing the metallic coating, the metallic bond coat promoting adhesion of the metallic coating to the airfoil.

24. The method according to claim 23, wherein the metallic bond coat is predominantly hafnium, silver, or a mixture thereof.

25. The method according to claim 24, wherein the metallic bond coat consists essentially of hafnium, optionally silver, and up to 25 weight percent of constituents that diffused from the metallic coating into the bond coat.

26. The method according to claim 16, wherein the airfoil is formed of a titanium alloy.

* * * * *